US007737086B2

(12) United States Patent
Allais et al.

(10) Patent No.: US 7,737,086 B2
(45) Date of Patent: Jun. 15, 2010

(54) METHOD FOR PRODUCING A SUPERCONDUCTIVE ELECTRICAL CONDUCTOR

(75) Inventors: Arnaud Allais, Saint Julien (DE); Nat Dirk Isfort, Brühl (DE)

(73) Assignee: Nexans, Paris (FR)

( * ) Notice: Subject to any disclaimer, the term of this patent is extended or adjusted under 35 U.S.C. 154(b) by 244 days.

(21) Appl. No.: 11/977,150

(22) Filed: Oct. 23, 2007

(65) Prior Publication Data

US 2008/0119365 A1 May 22, 2008

(30) Foreign Application Priority Data

Nov. 17, 2006 (EP) ................................ 06291793

(51) Int. Cl.
*H01L 39/24* (2006.01)

(52) U.S. Cl. ...................... 505/238; 505/236; 505/237; 505/125; 505/232; 505/230; 174/125.1; 174/15.5

(58) Field of Classification Search ................ 505/238, 505/236, 237, 125, 232, 230; 174/125.1, 174/15.5

See application file for complete search history.

(56) References Cited

U.S. PATENT DOCUMENTS 5,739,086 A 4/1998 Goyal et al. ................ 505/473
7,273,569 B2 * 9/2007 Walter et al. ................ 252/500
7,622,425 B2 * 11/2009 Allais et al. ................ 505/236
2004/0162223 A1 * 8/2004 Walter et al. ................ 505/230
2008/0039330 A1 * 2/2008 Wolf et al. ................ 505/100
2008/0165455 A1 * 7/2008 Isfort et al. ................ 361/19
2009/0105080 A1 * 4/2009 Isfort et al. ................ 505/237
2009/0170709 A1 * 7/2009 Allais et al. ................ 505/230

* cited by examiner

*Primary Examiner*—Douglas Mc Ginty
(74) *Attorney, Agent, or Firm*—Sofer & Haroun, LLP

(57) ABSTRACT

A method is provided for producing a superconductive electrical conductor (7) in which a layer of an yttrium-barium-copper oxide (YBCO) is applied as a superconductive material onto a textured metal base directly or after prior application of a buffer layer, and is subjected to a heat treatment. To this end an interlayer of a metallic material which is compatible with the crystal structure of YBCO, or with the structure of a buffer layer suitable for the application of YBCO, is initially applied all around onto an elongate metal support (1). The support (1) provided with the interlayer is subsequently processed so that predetermined texturing is imparted to the interlayer as a metal base for the layer of YBCO material or for the buffer layer. The layer of superconductive YBCO material is then applied all around, directly onto the textured interlayer or onto the buffer layer previously applied thereon, and the heat treatment is finally carried out.

5 Claims, 1 Drawing Sheet

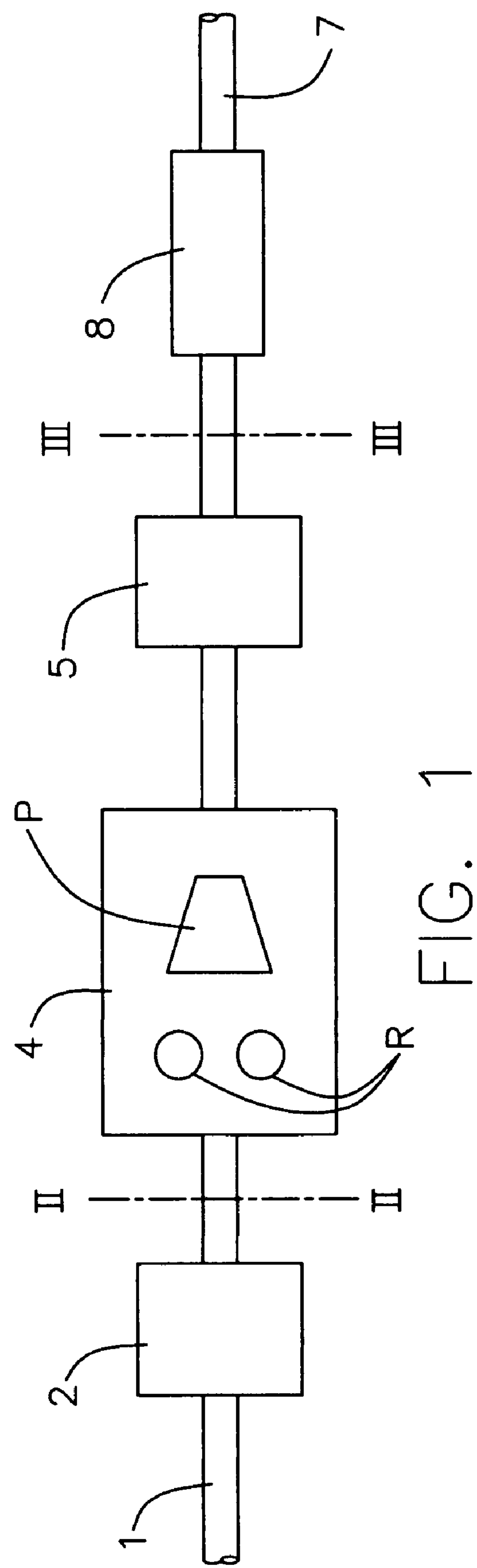
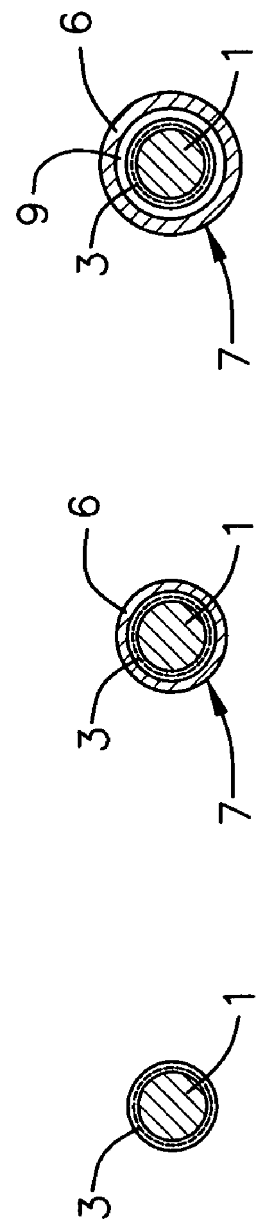
FIG. 2
FIG. 3
FIG. 4

METHOD FOR PRODUCING A SUPERCONDUCTIVE ELECTRICAL CONDUCTOR

RELATED APPLICATION

This application claims the benefit of priority from European Application No. 06291793.5, filed on Nov. 17, 2006, the entirety of which is incorporated herein by reference.

FIELD OF THE INVENTION

The invention relates to a method for producing a superconductive electrical conductor, in which a layer of an yttrium-barium-copper oxide (YBCO) is applied as a superconductive material onto a textured metal base directly or after prior application of a buffer layer, and is subjected to a heat treatment (U.S. Pat. No. 5,739,086).

BACKGROUND

A superconductive electrical conductor consists of a special material, which enters the superconductive state at sufficiently low temperatures. The electrical resistance of a correspondingly constructed conductor thereby tends towards zero. Suitable materials are for example YBCO (yttrium-barium-copper oxide) or BSCCO (bismuth-strontium-calcium-copper oxide). Sufficiently low temperatures for such a material to achieve the superconductive state lie, for example, between 4 K and 110 K. Corresponding superconductive conductors are referred to as high-temperature superconductors. Suitable refrigerants are for example nitrogen, helium, neon and hydrogen or mixtures of these substances, respectively in the liquid state.

U.S. Pat. No. 5,739,086, which was mentioned in the introduction, describes various methods for producing high-temperature superconductors. In the case of a BSCCO superconductor, for example, a silver tube is filled with the BSCCO material in powder form, and is sealed. The superconductive state is achieved by mechanical shaping of the tube and subsequent heat treatment (annealing). In the case of the YBCO superconductor which is particularly suitable for electrical cables and windings owing to its outstanding electrical properties, a buffer layer likewise consisting of metal is initially applied onto an e.g. biaxially textured strip of metal as a substrate, and then the YBCO material is applied thereon. The substrate consists for example of nickel, copper or iron, or an alloy. Copper or silver, for example, are used for the buffer layer. The YBCO material is subsequently brought into the superconductive state likewise by heat treatment. The superconductive conductor produced in this way—as already mentioned—may be used advantageously in electrical cables and windings for electrical motors and magnets. Owing to the strip shape, however, it can in this case be bent only in one direction.

OBJECTS AND SUMMARY

It is an object of the invention to refine the method presented in the introduction so as to obtain a more readily processable superconductive conductor based on YBCO.

This object is achieved according to the invention in that an interlayer of a metallic material, which is compatible with the crystal structure of YBCO or with the structure of a buffer layer suitable for the application of YBCO, is initially applied all around onto an elongate metal support, in that the support provided with the interlayer is subsequently processed so that predetermined texturing is imparted to the interlayer as a metal base for the layer of YBCO material or for the buffer layer, in that the layer of superconductive YBCO material is then applied all around, directly onto the textured interlayer or onto the buffer layer previously applied thereon, and in that the heat treatment is finally carried out.

This method provides an electrical conductor, capable of entering the superconductive state, which has a preferably circular cross section and can be processed in the same way as conventional wire-shaped conductors. A particular direction for bending the conductor is no longer necessary. It is therefore suitable in particular for the production of windings for electrical motors and magnets, but also for the construction of electrical cables using conventional devices.

BRIEF DESCRIPTION OF THE DRAWINGS

The method according to the invention will be explained as an exemplary embodiment with the aid of the drawings.

FIG. 1 schematically shows an arrangement for carrying out the method according to the invention.

FIGS. 2 and 3 show sectional views of FIG. 1 along the lines II-II and III-III in enlarged representations.

FIG. 4 shows a cross section through a superconductive conductor producible by the method.

DETAILED DESCRIPTION

A metal support, which may be configured as a strand, cord or tube, is denoted by 1. It advantageously has a circular cross section and preferably consists of steel, and it can also be used as a tension-proof central element for a superconductive conductor to be produced. The support 1 preferably has an outer diameter lying between 0.5 mm and 3.0 mm.

An interlayer 3 which serves as a metal base for YBCO material, or for a suitable buffer layer onto which the YBCO layer is then applied, is applied all around onto the support 1 in a device 2. The interlayer 3 consists of a metallic material, for example nickel, copper or iron or an alloy, which is compatible with the crystal structure of YBCO or with the structure of the buffer layer suitable for the application of YBCO. Conventional coating methods may be used for applying the interlayer 3, for example the PVD method (physical vapour deposition), the CVD method (chemical vapour deposition) or the CSD method (chemical solution deposition). The PVD method may comprise all customary vacuum coating methods, for example sputtering, electron beam evaporation and arc evaporation as well as ion-assisted methods.

The material of the interlayer 3 is applied with a wall thickness which advantageously lies between 20 nm and 1 mm. The coated support 1 is subsequently treated in an apparatus 4 so that the interlayer 3 receives pronounced texturing with controlled alignment of the crystals, in which as far as possible all the crystals are aligned mutually parallel. The support 1 is then enclosed by a textured base, closed all around, for YBCO or for a buffer layer onto which the YBCO is applied.

The texturing of the interlayer 3 may be achieved mechanically or thermally, or advantageously mechanically/thermally or by applying a magnetic field. In the case of a mechanical treatment, the coated support 1 is for example rolled or particularly advantageously pulled through at least one pulling block in order to reduce the diameter. Corresponding devices "R" and "P" are schematically indicated in the apparatus 4 in FIG. 1. In a thermomechanical treatment which may advantageously be carried out, the thickness of the interlayer 3, which encloses the support 1, may be reduced by pulling to about 1% to 5% of its original cross section in a temperature range between room temperature and 300° C. The reduction should ideally be carried out in a plurality of steps, i.e. with no more than a 10% cross section reduction per step. Following this, a recrystallization anneal may advantageously be carried out at from 700° C. to 1200° C. The temperature depends on the alloy used for the interlayer 3. A temperature of 700° C. may be employed for pure nickel, whereas temperatures of from 1000° C. to 1100° C. may be employed for a nickel alloy with 5% of tungsten added.

For alignment of the crystals to be achieved by magnetic treatment, the support 1 encased with the interlayer 3 may be pulled through a correspondingly strong magnetic field in the apparatus 4.

After the described treatment of the interlayer 3, a layer 6 of YBCO material, the thickness of which may advantageously lie between 1 μm and 5 μm, may be applied all around thereon in an apparatus 5. This may again be done by the aforementioned coating methods known per se, i.e. for example the PVD method, the CVD method or the CSD method. Downstream of the apparatus 5, a round conductor 7 coated with superconductive YBCO material is then obtained, which is finally subjected to a heat treatment, and preferably annealed, in order to achieve the superconductivity in a device 8. This may advantageously be done at temperatures of from 700° C. to 850° C.

In order to protect the interlayer 3, a buffer layer 9 closed all around (FIG. 4) with a thickness of for example 100 nm to 200 nm, which consists for example of ceramic, may also be applied thereon before applying the layer 6 of YBCO material. Suitable materials are, for example, cerium oxide or lanthanum-zirconium oxide. The buffer layer 9 may be applied by the same coating methods as mentioned for the interlayer 3 and the layer 6 of YBCO material. The layer 6 of YBCO material is next applied onto the buffer layer 9 as described, and then the heat treatment is carried out in the device 8.

The buffer layer 9 may, for example, consist of lanthanum acetylacetonate/zirconium acetylacetonate ($La_2Zr_2O_7$). It is obtained for example by dip-coating the interlayer 3 in a solution, in which the specified materials are dissolved in propionic acid. The support 1 is in this case pulled through the solution. A liquid layer, which subsequently dries (the solvent evaporates), therefore remains uniformly on the surface of the support 1. The dried layer is then passed through a heat-treatment oven at 1000° C., so that organic constituents are decomposed and removed with the process gas. An epitaxially grown $La_2Zr_2O_7$ layer is left behind as an interlayer 3, onto which the layer 6 of YBCO material can likewise be applied epitaxially.

The invention claimed is:

1. Method for producing a superconductive electrical conductor having a circular cross section, in which a layer of an yttrium-barium-copper oxide (YBCO) is applied as a superconductive material onto a textured metal base after prior application of a buffer layer, and is subjected to a heat treatment, said method comprising the steps of:

initially applying an interlayer of a metallic material, which is compatible with the structure of a buffer layer suitable for the application of YBCO, all around onto an elongate metal support;

processing the support provided with the interlayer so that predetermined texturing is imparted to the interlayer as a metal base for the buffer layer;

applying a ceramic buffer layer to the interlayer in a thickness between 100 nm and 200 nm;

applying, all around, the layer of superconductive YBCO material, onto the buffer layer previously applied thereon; and carrying out the heat treatment.

2. Method according to claim 1, wherein the interlayer is textured by mechanical shaping.

3. Method according to claim 1, wherein the interlayer is textured by heat treatment.

4. Method according to claim 1, wherein the interlayer is textured by thermomechanical processing.

5. Method according to claim 1, wherein the interlayer is textured by applying a magnetic field.

* * * * *